United States Patent [19]

Landes

[11] 4,341,574

[45] Jul. 27, 1982

[54] ULTRASONIC BOND ENERGY MONITOR

[75] Inventor: James L. Landes, Plano, Tex.

[73] Assignee: Texas Instruments Incorporated, Dallas, Tex.

[21] Appl. No.: 180,796

[22] Filed: Aug. 25, 1980

[51] Int. Cl.$^3$ .......................... B23K 1/06; B29C 27/08
[52] U.S. Cl. ..................................... 156/64; 156/73.1; 156/73.2; 156/378; 156/580.1; 228/110; 228/1 R
[58] Field of Search ..................... 156/73.1, 73.2, 73.3, 156/73.4, 580.1, 64, 378; 228/110, 1 R, 1 A

[56] References Cited

U.S. PATENT DOCUMENTS

| | | | |
|---|---|---|---|
| 3,153,850 | 10/1964 | Worlton et al. | 228/1 |
| 3,212,695 | 10/1965 | MacGregor | 228/1 R |
| 3,573,781 | 4/1971 | Shoh | 228/1 R |
| 3,784,079 | 1/1974 | Spanjer | 228/1 |
| 3,794,236 | 2/1974 | Salzer et al. | 228/1 R |
| 3,827,619 | 8/1974 | Cusick et al. | 228/1 R |
| 4,040,885 | 8/1977 | Hight et al. | 156/73.2 |

FOREIGN PATENT DOCUMENTS 1496137 12/1977 United Kingdom ............. 156/580.1

Primary Examiner—Michael G. Wityshyn
Attorney, Agent, or Firm—Mel Sharp; Richard L. Donaldson; Douglas A. Lashmit

[57] ABSTRACT

A monitor for optimizing the ultrasonic bonding of materials by analyzing the impedance of an ultrasonic transducer used to effect the bond. The electrical impedance of the transducer, which is proportional to its mechanical impedance, is determined by applying an ultrasonic voltage thereto and monitoring the resultant change in current amplitude. A pair of differentiators produces a second derivative signal of the impedance with respect to time, with a negative-going zero crossing of this signal corresponding to completion of the bond. Loss of wire, mechanical malfunctions and improper bonds are also detected by the monitor, to form a real time quality control system.

6 Claims, 7 Drawing Figures

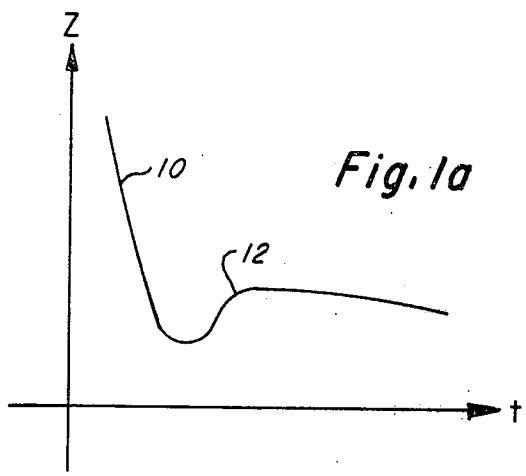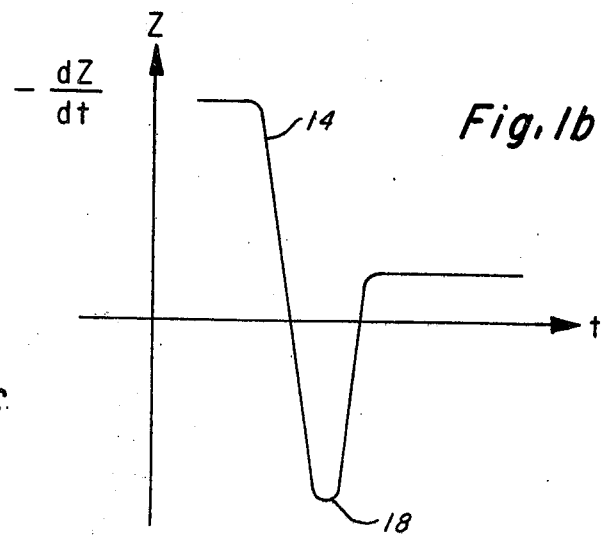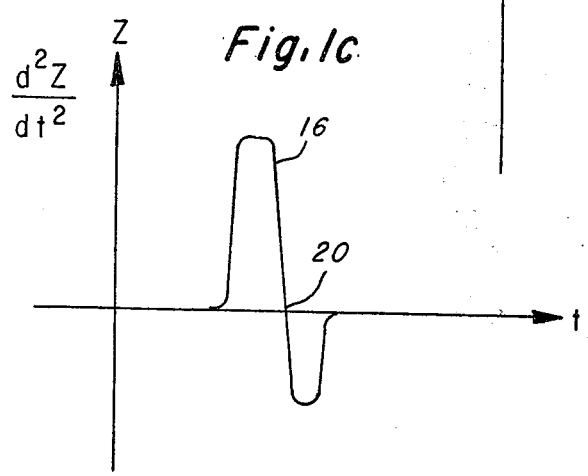

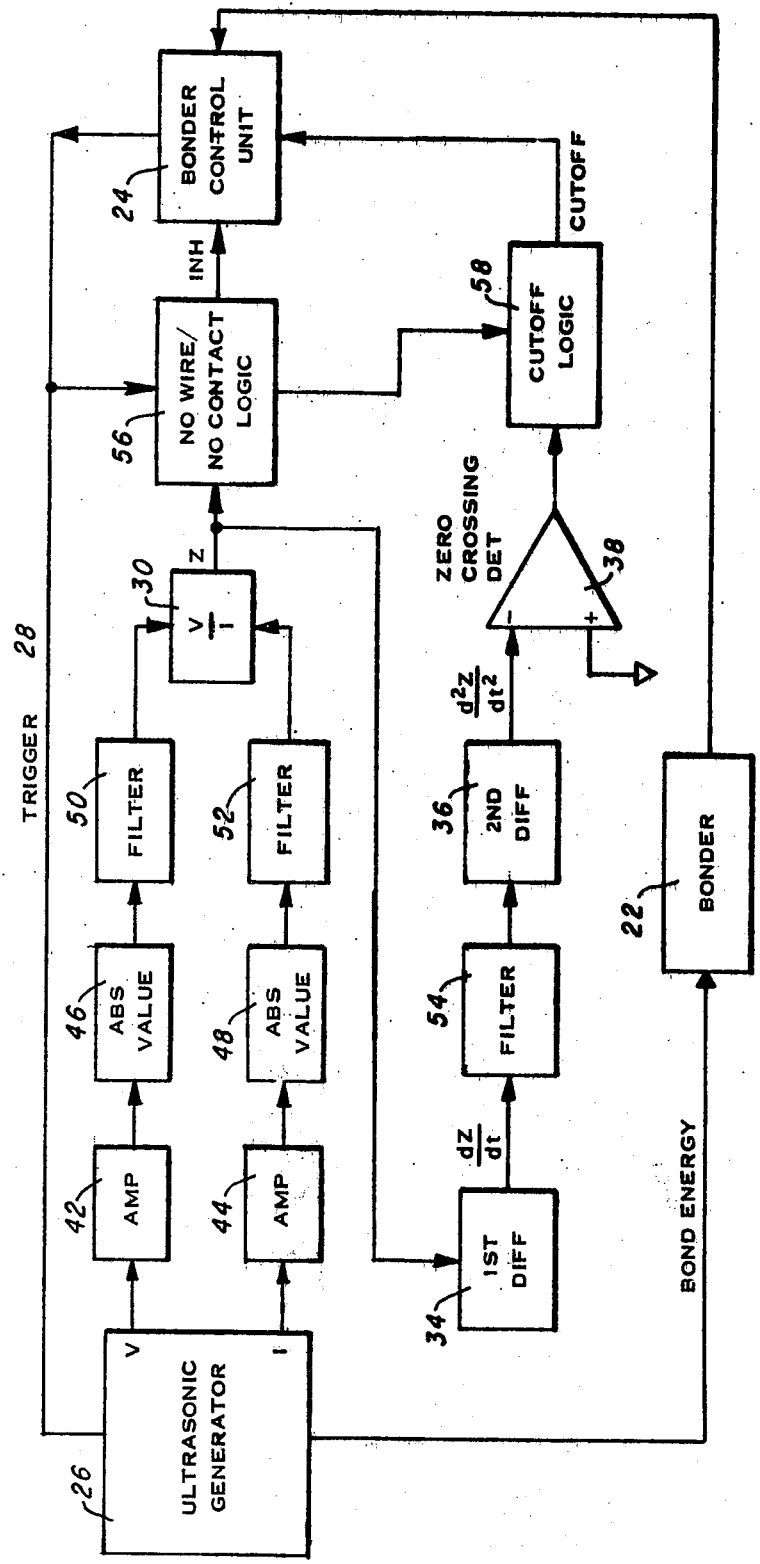

ULTRASONIC BOND ENERGY MONITOR

BACKGROUND OF THE INVENTION

This invention relates generally to the ultrasonic bonding of materials and more particularly to a method and apparatus for optimizing wire bonding, for example, in the manufacture of semiconductor integrated circuits.

In the manufacture of integrated circuits, wire bonding is used to connect the electrical contacts on the semiconductor devices to larger stronger leads on the IC package. Typically, the device contacts are aluminized bond pad areas. A fine gold or aluminum wire must be metallurgically connected to both the bond pad and to the IC package lead in a stress-free loop that can withstand certain mechanical punishment.

In the ultrasonic bonding process, a metallurgical bond is achieved through the proper transmittal of ultrasonic energy under pressure to the bond interface. Consistent and reliable bonding requires optimization of the parameters of energy, clamping force or pressure, time, and bonding pad and IC package condition. The term ultrasonic bonding as used herein includes thermosonic bonding wherein heat is applied during the bonding process. Various combinations of energy amplitude, pressure, time and bonding tool configurations have been used to attempt to achieve consistent high quality bonds. However, the parameters for a particular bonding system are determined in a trial and error manner by adjusting the parameters and inspecting the resultant bonds until consistent bonds having high pull strength have been achieved.

One disadvantage of this method is that, even if optimum settings are achieved at the beginning of a production run, the degradation in the bonding tool after a certain number of bonds, variations in the amplitude and time settings, and variations in the wire or bonding pad materials may cause inconsistent or incomplete bonds. For example, an excessive time setting can cause cratering, or the fracturing of the silicon under the bonding pad, as well as aluminum buildup on the bonding tool necessitating more frequent replacement. Too low a time setting, on the other hand, can cause an incomplete bond which may lead to rejection of the entire IC. This is especially critical in the case of automatic bonders where numerous bonds are made in rapid succession. Many insufficient bonds may go undetected before corrective actions can be taken.

SUMMARY OF THE INVENTION

Accordingly, the present invention provides a method and apparatus for optimizing ultrasonic bonds by monitoring the impedance of an ultrasonic transducer used to produce the bond. It has been determined that the completion of a bond occurs when the second derivative of the transducer impedance is negative-going and equal to zero, the zero crossing feature being independent of the other bonding parameters.

In one embodiment of this invention, signals proportional to the voltage and current in the ultrasonic transducer are combined in a divider to produce a signal proportional to the impedance thereof, which is also proportional to the transducer mechanical impedance. The impedance signal is coupled in sequence to two differentiators to provide the second derivative of impedance with respect to time. A cutoff logic circuit terminates the bonding process when the negative-going zero crossing of the second derivative impedance signal is detected.

Another embodiment of the present invention includes an additional logic circuit to inhibit the ultrasonic bonder when the magnitude of the impedance is outside of a predetermined range, indicating that either there is no wire in the bonding tool or the tool has not made contact with the bonding pad on the semiconductor device.

It is an object of this invention to provide a method for optimizing the ultrasonic bonding of materials.

Another object of this invention is to provide a monitor for determining when an optimum ultrasonic bond is completed and thereafter terminating the bonding process.

Still another object of this invention is to provide a monitor for use with an ultrasonic bonding system which inhibits the bonder when selected mechanical malfunctions are detected.

BRIEF DESCRIPTION OF THE DRAWINGS

The novel features believed characteristic of theinvention are set forth in the appended claims. The invention itself, however, as well as further objects and advantages thereof, will be best understood by reference to the following detailed description of an illustrative embodiment, when read in conjunction with the accompanying drawings in which like numerals represent like parts throughout the several views, and wherein:

FIG. 1a is a graphical representation of the impedance plotted as a function of time of a typical ultrasonic transducer during the bonding process;

FIGS. 1b and 1c are graphical representations of the first and second derivatives, respectively, of the impedance curve of FIG. 1a plotted as a function of time;

FIG. 3 is a block diagram of another embodiment of an ultrasonic bond energy monitor.

DESCRIPTION OF THE PREFERRED EMBODIMENT

Figure 2:
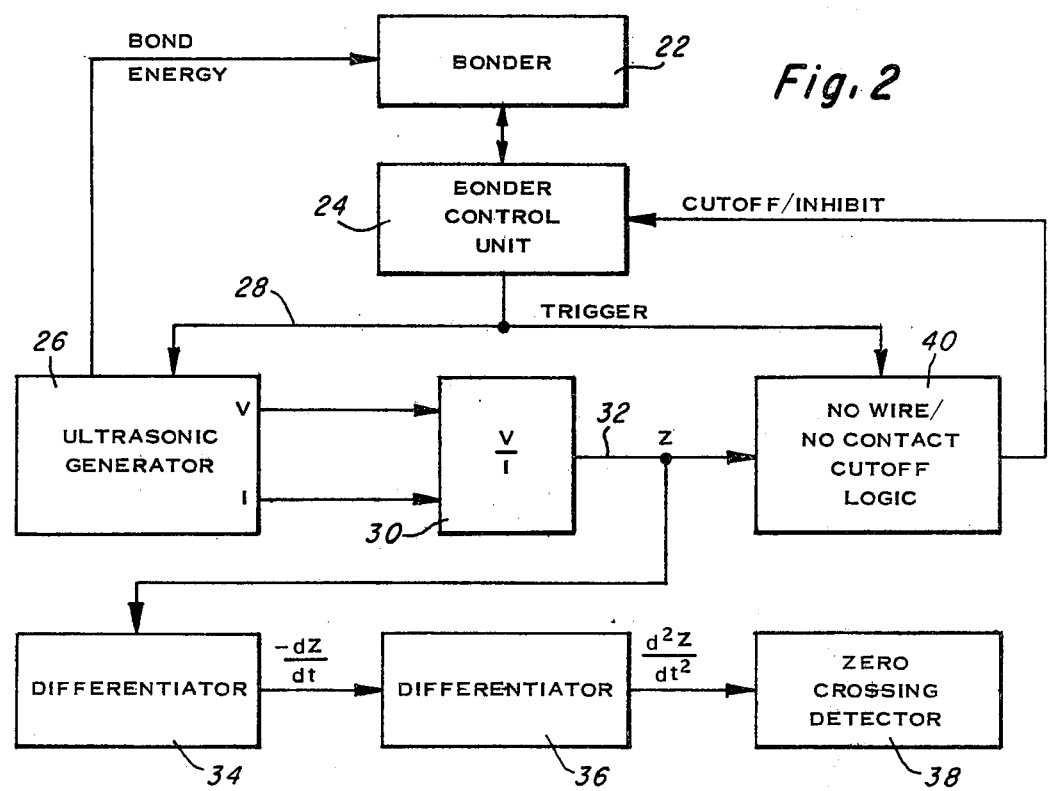
FIG. 2 is a block diagram of an ultrasonic bond energy monitor according to one embodiment of the present invention.

Referring now to the drawings, there is shown in FIG. 1a an impedance versus time curve 10 for a typical ultrasonic transducer during the bonding process. The impedance initially has a high value due to the transducer inertia and initial tuning of the ultrasonic generator to resonance. The impedance decreases during bonding and then increases until completion of the bond at approximately point 12 on curve 10. Plots of the negative first derivative 14 and positive second derivative 16 of impedance versus time are shown in FIGS. 1b and 1c, respectively. It is evident that the bond completion point 12 on curve 10 corresponds to the maximum positive value at point 18 on the first derivative curve 14. Similarly, point 18 on curve 14 corresponds to the negative going zero crossing at point 20 on the second derivative curve 16. It has been found that the zero crossing point 20 corresponds to bond completion independent of the power level used or the particular shape of the impedance curve 10.

Based upon this effect, the present invention monitors the impedance of an ultrasonic transducer in a manual or an automatic bonder and, upon the negative-going zero crossing of the second derivative of impedance, produces a cutoff signal to stop the bonder when the bond is completed. Referring to FIG. 2, there is shown in block diagram form one embodiment of the present invention applied to a bonding system having a bonder 22, a bonder control unit 24, and an ultrasonic generator 26. In a typical system, bonder 22 contains a bonding tool, wire feed mechanism and means to move the tool and wire to various points on the integrated circuit being fabricated. Generator 26 has, for example, a piezoelectric transducer to provide ultrasonic energy to the tool in bonder 22. Bonder control unit 24 stores the predetermined coordinates of the points to be bonded and provides signals to properly position the bonding tool in bonder 22. Control unit 24, which provides a trigger signal 28 to activate generator 26 when the tool has been properly positioned, also controls the wire feed, power and time settings of the bonder 22. In the present monitor, signals corresponding to the voltage and current of the transducer in generator 26 are coupled to a divider 30 that generates an impedance signal at its output 32. The output 32 of divider 30 is connected in coupling sequence to two differentiators 34 and 36 and a zero crossing detector 38 which provides a logic level output to a logic circuit 40 when the output of differentiator 36, corresponding to the second derivative of transducer impedance with respect to time, crosses zero. Logic circuit 40 is coupled to bonder control unit 24 and provides a cutoff signal thereto to turn off generator 26 when bond completion has been detected. Logic circuit 40 is also coupled directly to divider 30 to monitor the magnitude of the impedance. If the impedance is outside of a predetermined range, corresponding to either no wire in the bonding tool or improper contact of the wire to the bonding pad area, logic circuit 40 produces an inhibit signal to control unit 24 which prevents generator 26 from being activated until corrective action can be taken. Logic circuit 40 is enabled by the same trigger signal 28 from control unit 24 that activates generator 26.

Figure 4A:
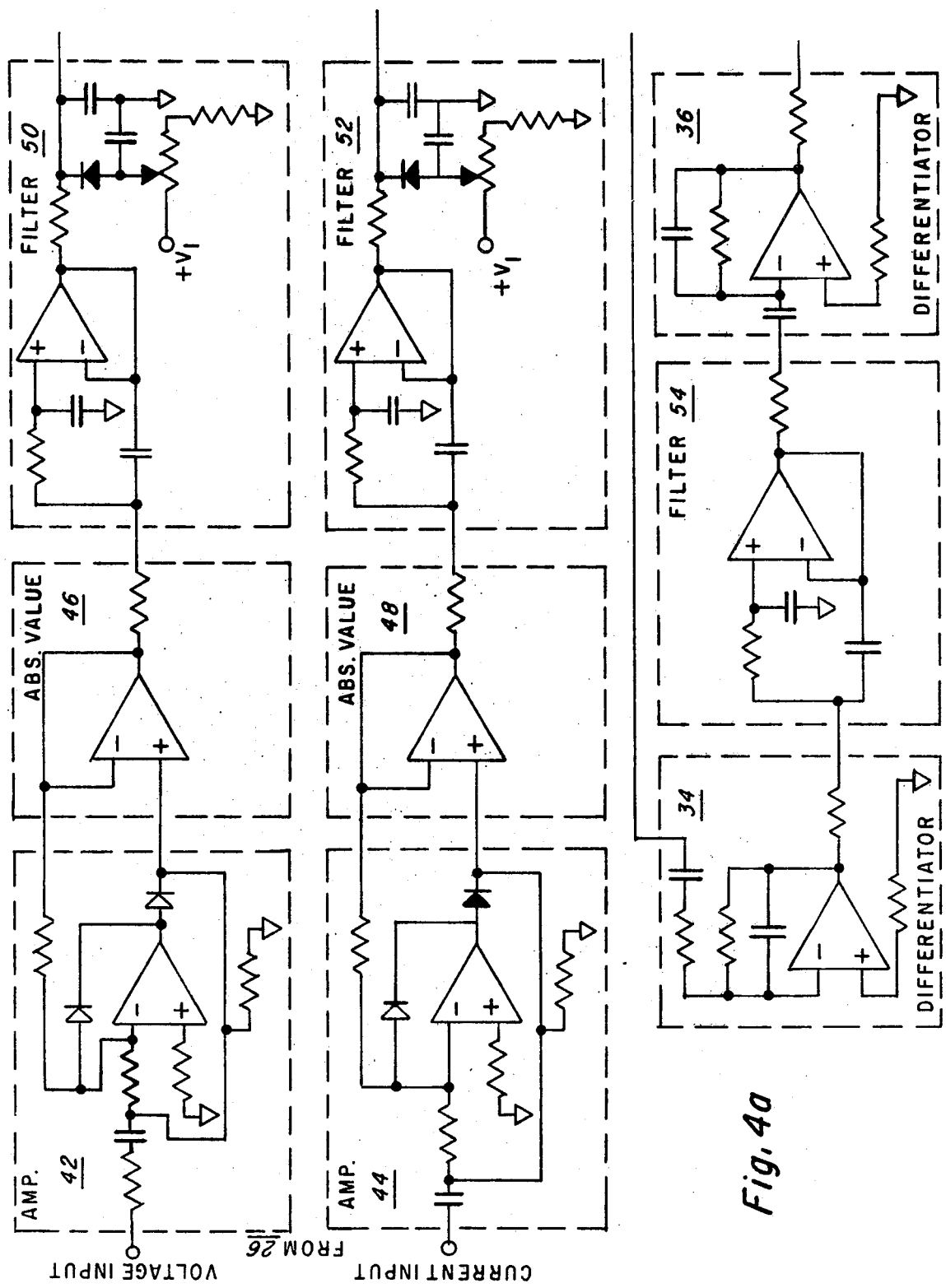
FIGS. 4a and 4b form is a schematic diagram of the monitor of FIG. 3.
Figure 4B:
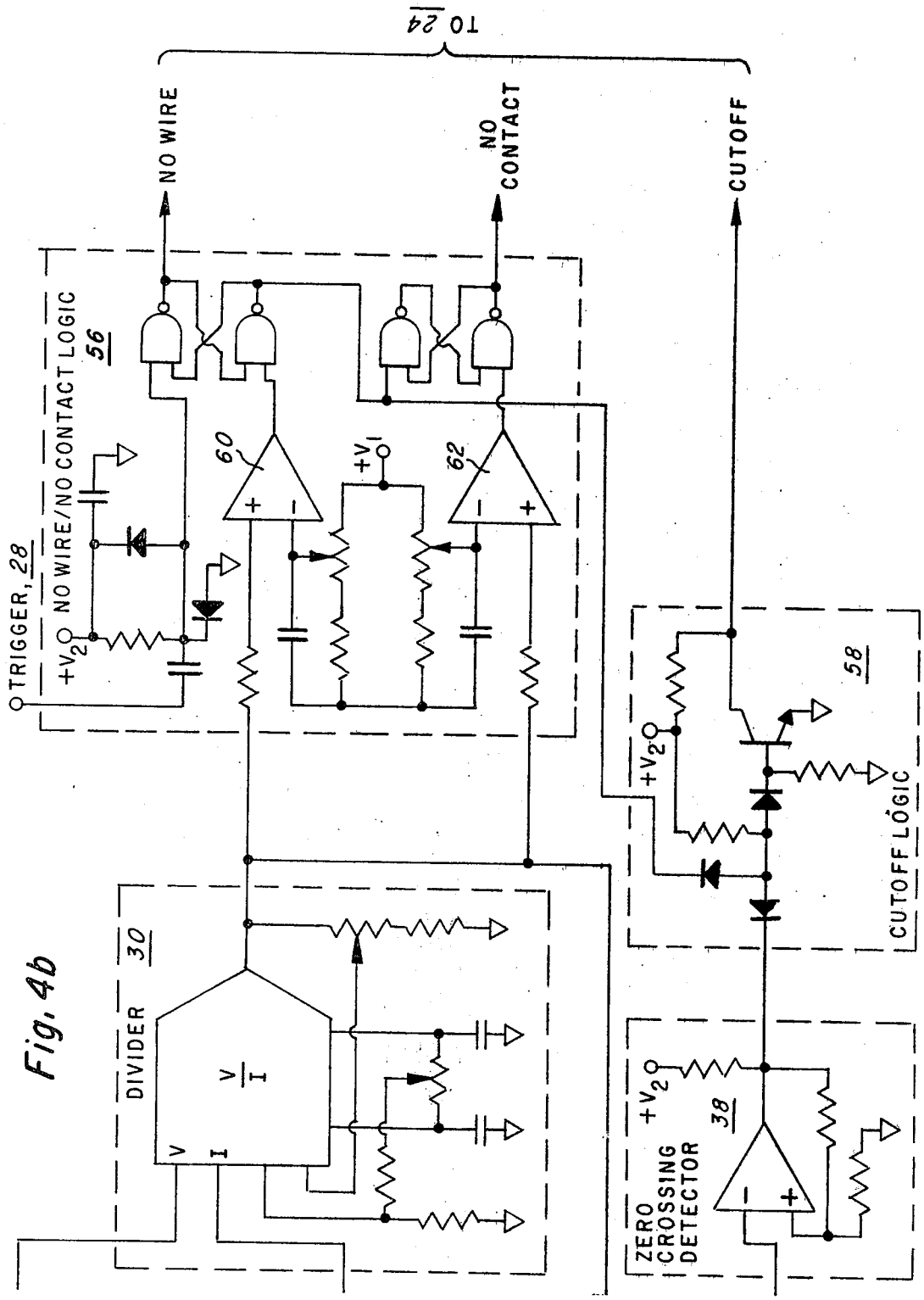

Referring now to FIG. 3, there is shown another embodiment of this invention wherein amplifiers 42, 44, absolute value detectors 46, 48, and filters 50, 52, are connected in coupling sequence between the voltage and current channels, respectively, of generator 26 and divider 30. These devices provide normalized, positive, distortion-free signals to divider 30 which then produces a more accurate real time value of impedance. A filter 54 is also coupled to the output of differentiator 34 to provide a more distortion-free signal to the input of differentiator 36. Third-order Chebyshev filters have been found particularly useful in this application. Logic circuit 40 is shown as a no wire/no contact logic circuit 56 and a cutoff logic circuit 58 which provide INHIBIT and CUTOFF signals, respectively, to bonder control unit 24. FIGS. 4a and 4b form is a schematic diagram of a monitor corresponding to the block diagram of FIG. 3, with the dashed lines delineating the respective functional portions of the circuit. Logic circuit 56 includes comparators 60 and 62 to set the upper and lower limits of the allowable impedance range. An impedance outside of this range causes either a no wire or a no contact (INHIBIT) signal to be coupled to bonder control unit 24 which in turn prevents ultrasonic generator 26 from being activated.

While an analog ultrasonic bond energy monitor has been disclosed in the above embodiments, it will be readily apparent to those skilled in the art that the analog voltage and current signals from generator 26 could be digitized and processed, for example, in a microprocessor to obtain the required impedance, second derivative, zero crossing detector, and impedance limit detectors. Alternatively, the impedance could be derived by analog means as disclosed and then digitized and processed by known means.

Thus, the present invention provides a real time quality control system for use with ultrasonic energy bonders that optimizes the bonds by monitoring and analyzing the impedance of the ultrasonic transducer during the bonding process. In addition, the monitor inhibits the bonder upon detection of a no wire or a no contact condition.

While the present invention has been described and illustrated with respect to a specific embodiment, it is to be understood various modifications may be made without departing from the spirit and the scope of the present invention.

What is claimed is:

1. A method for optimizing the bonding of materials by ultrasonic energy radiating from a transducer, comprising the steps of:
    monitoring the ultrasonic voltage and current in said transducer;
    generating a signal corresponding to the impedance of said transducer as a function of said voltage and said current; and
    terminating said bonding process when the second derivative of said impedance signal with respect to time reaches a predetermined value.

2. The method of claim 1 further characterized by terminating said bonding process when the second derivative of said impedance signal is negative-going and substantially equal to zero.

3. The method of claims 1 or 2 wherein said voltage is maintained at substantially a constant amplitude.

4. In a bonding system having an ultrasonic transducer for generating energy to effect a bond, a monitor for indicating when an optimum bond has been produced comprising:
    means for generating signals corresponding to the voltage and current in said ultrasonic transducer;
    impedance determining means coupled to said voltage and said current signal means for producing a signal corresponding to the impedance of said transducer as a function of said voltage and current signals;
    differentiating means coupled to said impedance means for producing a signal corresponding to the second derivative of said impedance signal with respect to time; and
    logic means coupled to said differentiating means for producing a bonder cutoff signal when said second derivative signal is negative going and equal to zero, said zero crossing corresponding to the completion of said bond.

5. The monitor of claim 4 wherein said differentiating means comprises:
    a first differentiator coupled to said impedance means wherein the output of said first differentiator corresponds to the first derivative of said impedance with respect to time; and
    a second differentiator coupled to said first differentiator wherein the output of said second differentiator corresponds to the second derivative of said impedance with respect to time.

6. The monitor of claim 4 wherein said logic means further includes:
    means for inhibiting said ultrasonic transducer whenever said impedance signal is outside of a predetermined range.

* * * * *